United States Patent
Bellizzi et al.

(10) Patent No.: US 12,463,167 B2
(45) Date of Patent: Nov. 4, 2025

(54) METHOD OF MANUFACTURING SEMICONDUCTOR DEVICES AND CORRESPONDING SEMICONDUCTOR DEVICE

(71) Applicant: STMicroelectronics S.r.l., Agrate Brianza (IT)

(72) Inventors: Antonio Bellizzi, Milan (IT); Marco Rovitto, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 587 days.

(21) Appl. No.: 17/833,233

(22) Filed: Jun. 6, 2022

(65) Prior Publication Data
US 2022/0392863 A1 Dec. 8, 2022

(30) Foreign Application Priority Data
Jun. 8, 2021 (IT) .................. 102021000014906

(51) Int. Cl.
*H01L 23/00* (2006.01)
*H01L 21/31* (2006.01)
(Continued)

(52) U.S. Cl.
CPC .......... *H01L 24/19* (2013.01); *H01L 21/4853* (2013.01); *H01L 21/4871* (2013.01);
(Continued)

(58) Field of Classification Search
CPC ......... H01L 23/367; H01L 23/42–4338; H01L 23/34–4735; H01L 31/024;
(Continued)

(56) References Cited

U.S. PATENT DOCUMENTS 11,856,856 B2 * 12/2023 Lu .................. H10N 19/00
2020/0127178 A1 4/2020 Kapusta et al.
(Continued)

FOREIGN PATENT DOCUMENTS

CN 112397397 A 2/2021
CN 218004831 U 12/2022
(Continued)

OTHER PUBLICATIONS

IT Search Report and Written Opinion for priority application, IT 102021000014906, report dated Feb. 22, 2022, 9 pgs.
(Continued)

*Primary Examiner* — Joshua Benitez Rosario
*Assistant Examiner* — Moataz Khalifa
(74) *Attorney, Agent, or Firm* — Crowe & Dunlevy LLC

(57) ABSTRACT

A semiconductor chip is arranged on a region of laser direct structuring (LDS) material of a laminar substrate. The semiconductor chip has a front active area facing towards, and a metallized back surface facing away from, the laminar substrate. An encapsulation of LDS material on the laminar substrate encapsulates the semiconductor chip with the metallized back surface of the semiconductor chip exposed at an outer surface of the encapsulation of LDS material. Electrically conductive lines and first vias are structured in the region of LDS material to electrically connect to the front active area of the semiconductor chip. A thermally conductive layer is plated over the outer surface of the encapsulation of LDS material in contact with the metallized back surface of the semiconductor chip. A heat extractor body of thermally conductive material is coupled in heat transfer relationship with the thermally conductive layer.

12 Claims, 4 Drawing Sheets

(51) Int. Cl.
*H01L 21/48* (2006.01)
*H01L 21/56* (2006.01)
*H01L 23/31* (2006.01)
*H01L 23/367* (2006.01)
*H01L 23/538* (2006.01)

(52) U.S. Cl.
CPC ........ *H01L 21/565* (2013.01); *H01L 23/3121* (2013.01); *H01L 23/367* (2013.01); *H01L 23/5386* (2013.01); *H01L 24/20* (2013.01); *H01L 2224/214* (2013.01)

(58) Field of Classification Search
CPC . H01L 31/052–0525; H01L 33/64–648; H01L 21/4871–4882; H01L 21/485–486; F28F 2260/02
See application file for complete search history.

(56) References Cited

U.S. PATENT DOCUMENTS

2020/0203187 A1   6/2020   Chew
2021/0050226 A1   2/2021   Derai et al.
2021/0050299 A1*  2/2021   Ziglioli ................ H01L 21/565

FOREIGN PATENT DOCUMENTS

KR        20200123572 A  * 10/2020
WO         2020038554 A1    2/2020

OTHER PUBLICATIONS

CN First Office Action and Search Report for counterpart CN Appl. No. 202210646310.5, report dated Jul. 26, 2025, 6 pgs.

* cited by examiner

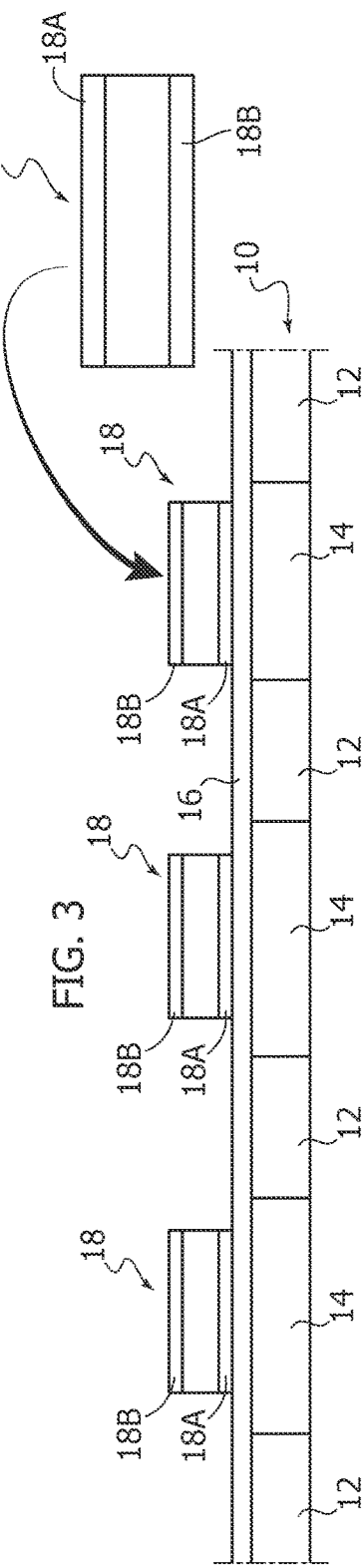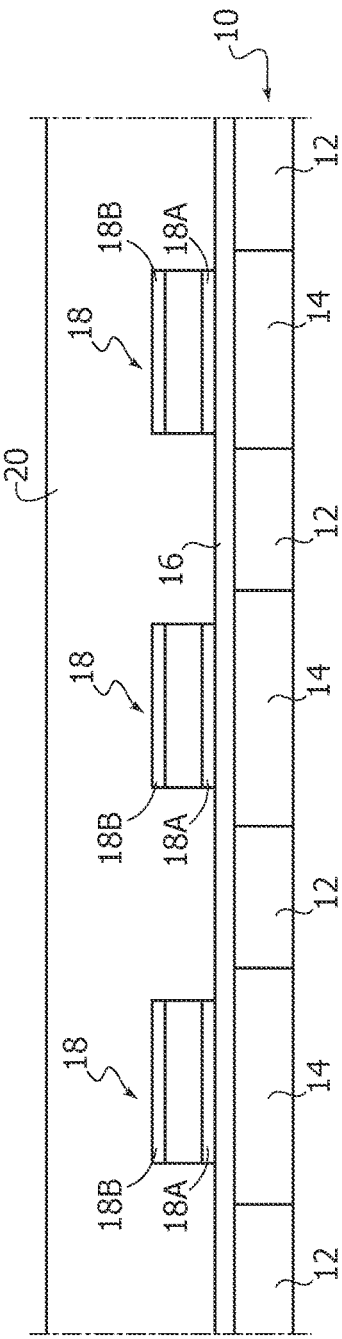

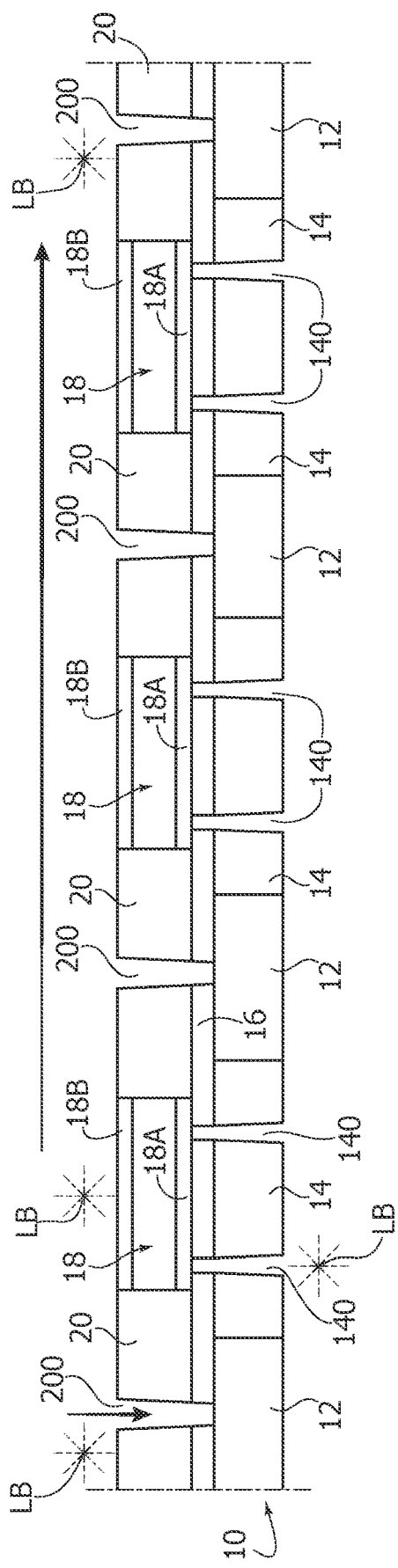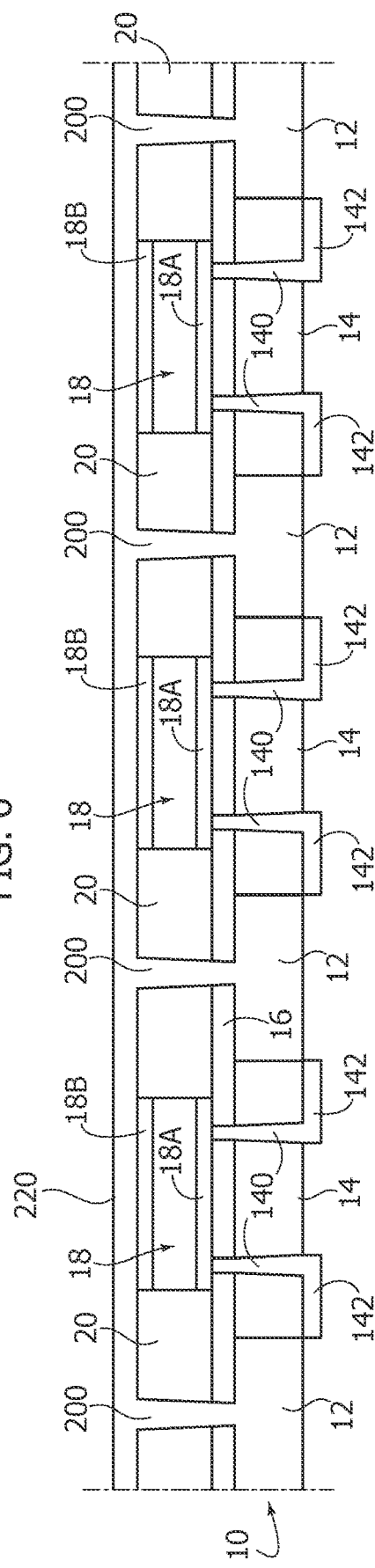

METHOD OF MANUFACTURING SEMICONDUCTOR DEVICES AND CORRESPONDING SEMICONDUCTOR DEVICE

PRIORITY CLAIM

This application claims the priority benefit of Italian Application for Patent No. 102021000014906, filed on Jun. 8, 2021, the content of which is hereby incorporated by reference in its entirety to the maximum extent allowable by law.

TECHNICAL FIELD

The description relates to manufacturing semiconductor devices.

One or more embodiments may be applied to semiconductor devices where high thermal draining (dissipation) is a desired feature.

BACKGROUND

In those semiconductor devices where high thermal draining (dissipation) is a desired feature, so-called "slug-up" configurations such as slug-up Quad-Flat No-leads or QFN packages are currently used having a heat extractor (heat dissipater or heat sink) mounted on top of an exposed heat slug at the top of the package.

A problem oftentimes encountered with such configurations lies in the die attach material between the back side metallization (BSM) of the semiconductor chip or die in the device and the heat slug.

Such interface material may represent a bottleneck in terms of heat dissipation.

An approach proposed for addressing that issue involves grinding the insulating encapsulation (molding) to expose the semiconductor chip or die at its backside. Such an approach was, however, found to induce undesired cracking, primarily when the semiconductor chip or die is made markedly thinner as a result of grinding.

There is a need in the art to contribute in addressing these issues.

SUMMARY

One or more embodiments relate to a method.

One or more embodiments relate to corresponding semiconductor device.

One or more embodiments provide a semiconductor chip package design that resorts to laser direct structuring (LDS) technology with the capability of achieving high thermal dissipation on top of the package as a result of directly exposing the die surface.

In one or more embodiments, the most critical thermal interface (to die attach material) is virtually eliminated.

One or more embodiments may provide a small, compact package outline that lends itself to being "tuned" starting from a simple leadframe design.

One or more embodiments may exhibit a full plated package top surface where the presence of an exposed die backside can be identified.

BRIEF DESCRIPTION OF THE DRAWINGS

One or more embodiments will now be described, by way of example only, with reference to the annexed figures, wherein:

FIGS. 1 to 7 are exemplary of various steps in embodiments as per the present description.

DETAILED DESCRIPTION

Figure 7:
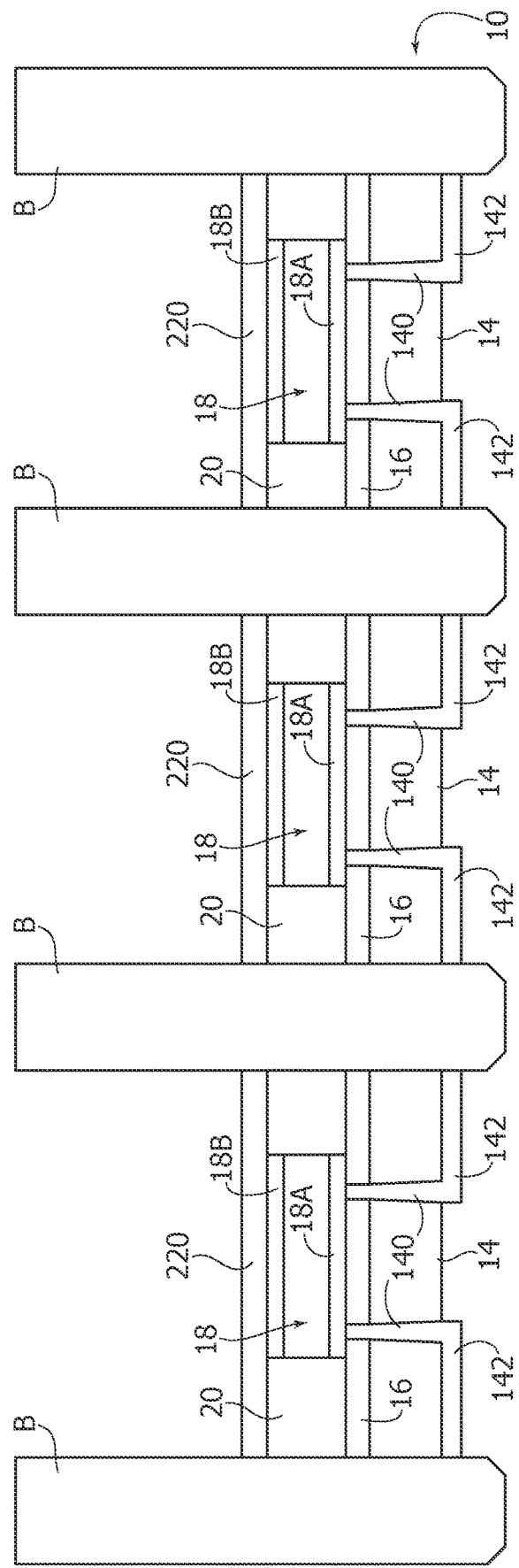

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Throughout the instant description, the designation laser direct structuring (LDS) will be use to refer to a laser-based technology now currently used in manufacturing semiconductor devices wherein electrically conductive formations such as lines and vias can be formed in an otherwise insulating molding compound via laser beam activation or "structuring", possibly followed by plating.

Laser direct structuring (LDS) technology (oftentimes referred to also as direct copper interconnection (DCI) technology) is discussed, for instance, in documents such as United States Patent Application Publication Nos. 2018/0342453, 2020/0203264, 2020/0321274, 2021/0050226 or 2021/0050299, all incorporated herein by reference and assigned to the same assignee of the instant application.

Understanding and predicting thermal dissipation performance prior to integrating a semiconductor device on a substrate such as a printed circuit board (PCB) is useful in order to facilitate device operation within defined temperature limits.

When a semiconductor device is running (operated), electrical energy absorbed thereby is transformed into heat.

Efficient and reliable operation of a semiconductor device is facilitated by adequate heat dissipation from the surface of a semiconductor chip or die to its immediate surrounding environment.

This is particularly the case with power packages integrated on substrates such a printed circuit boards (PCBs) where high currents are developed that generate heat during device operation.

Device performance and reliability improves as a result of the thermal dissipation capability of the package being increased with thermal failures avoided.

In conventional devices including a semiconductor chip or die attached on a die pad, the thermal resistance at the interface between the die and the die attach material plays a significant role in determining the thermal performance of the device. To some extent, thermal conductivity of the die attach material is crucial in facilitating adequate device performance.

An approach proposed in the past in order to improve thermal performance involves using so-called "slug-up" packages having an exposed pad at the front (top) side that facilitates extraction of heat from the front or top surface of a semiconductor die using an external heat dissipator.

A somewhat similar approach involves package grinding to expose the die backside to facilitate heat transfer to a heat sink.

Even leaving other points aside, it is noted that common slug-up packages are not able to adequately exploit the top side surface for heat extraction, with the die attach material still found to represent a bottleneck in determining device thermal performance.

Also, a package grinding process as proposed was found to create die strength issues that may result in undesired die cracks.

One or more embodiments may involve starting from a (planar) substrate 10 that can be essentially likened to a so-called "pre-molded" leadframe.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Leadframes are conventionally created using technologies such as a photo-etching technology. With this technology, metal (e.g., copper) material in the form of a foil or tape is etched on the top and bottom sides to create various pads and leads.

Pre-molded leadframes are currently used that include electrically insulating resin such as epoxy resin, for instance, molded onto a sculptured (e.g., photo-etched) leadframe using a flat molding tool, for instance. Spaces left in the etched metal material are filled by pre-molding resin and the resulting leadframe has a total thickness that is the same thickness of the original etched leadframe.

Essentially, the substrate 10 illustrate in the figures can be considered as a pre-molded leadframe wherein (only) electrically conductive connecting bars 12 providing a sculptured (e.g., etched) electrically conductive structure onto which an insulating material such as LDS material 14 is molded.

Providing such a substrate 10 involves otherwise conventional processes (e.g., using a flat molding tool), which makes it unnecessary to provide a more detailed description herein.

The insulating material 14 between the connecting bars 12 being an LDS material is beneficial in so far as a plating process can be applied thereto as discussed in the following.

FIG. 2 is exemplary of an insulating film 16 being laminated onto one (here front or top) surface of the structure of FIG. 1.

An Ajinomoto Build-up Film (ABF) from Ajinomoto, for instance, is exemplary of an insulating film that can be advantageously used in arrangements as discussed herein.

FIG. 3 is exemplary of semiconductor chips or dice 18 being placed onto the insulating film 16 at the molding compound portions 14 between the connecting bars 12 of the structure illustrated in the previous figures.

As illustrated in the right-hand side of FIG. 2 (where one die 18 is reproduced in an enlarged scale) the dice 12 are placed onto the film 16 turned upside-down, namely with their active area 18A provided at the front or top surface of the die 12 placed facing downwards adjacent the insulating film 16 and the back side metallization BSN layer 18B of the die 18 facing upwards, away from the insulating film 16.

It is noted that FIGS. 1 to 7 herein refer to plural semiconductor devices being produced simultaneously to be finally separated in a "singulation" step (see FIG. 7) as otherwise conventional in the art.

FIG. 4 is exemplary of an encapsulation (cap) of LDS molding compound 20 being formed (in a manner known per se to those of skill in the art) onto the structure of FIG. 3 so that the devices 18 are embedded in the encapsulation 20.

FIG. 5 is exemplary of laser beam processing (generally indicated LB) applied to both sides of the structure of FIG. 4.

Such laser beam processing can be performed using a laser beam sources as currently used in LDS technology with a two-fold purpose.

In the first place, laser beam processing LB is applied to the LDS encapsulation or cap 20 to ablate the encapsulation or cap down to the level of the backside metallization layers 18B of the semiconductor dice 18 so that the metallization layers 18B are exposed at the (ablated) surface of the LDS encapsulation or cap 20.

In the second place, laser beam processing LB results in vias being drilled through the LDS material both in the portions 14 of the substrate 10 and in the LDS encapsulation or cup 20.

Specifically: first vias 140 are structured (drilled) extending from the outer (here lower) surface of the portions 14 of the substrate 10 up to the active areas 18A of the dice 18 together with a pattern of lines 142 at the outer (here lower) surface of the substrate 10; and second vias 200 are structured (drilled) extending from the outer (here upper) surface of the encapsulation or cap 20 down to the connecting bars 12 in the substrate 10.

As illustrated, both vias 140 and 200 extend through the insulating layer 16.

FIG. 6 is exemplary of plating processing applied (as otherwise conventional in the art) to the vias 140 and 200 structured via laser beam energy LB applied as discussed previously in connection with FIG. 5.

In the first place, such plating has the purpose of facilitating making the vias 140 and 200 electrically conductive.

In the second place: with respect to the vias 140 provided through the substrate 10, the plating has the purpose of creating a pattern of electrically-conductive lines 142 at the outer (here lower) surface of the substrate 10 that cooperate with the vias 140 in providing electrical connection for the active areas 18A of the dice 18; and with respect to the LDS molding compound encapsulation or cap 20, the plating is performed in such a way to form a backside metallization layer 220 that extends over the (entire) outer—here upper—surface of encapsulation or cap 20.

Plating the metallization layer 220 is facilitated by the electrically conductive path(s) provided by the vias 200 and the connecting bars 12 in the substrate 10.

In one or more embodiments, plating the metallization layer 220 is further facilitated by the provision of a pre-molded leadframe substrate 10 wherein the connecting bars 12 form a mesh pattern, for example a rectangular mesh pattern, of electrically connected conductive material regions 12.

A structure as illustrated in FIG. 6 can then be singulated via sawing blades B, as exemplified in FIG. 7, thereby providing individual semiconductor devices 100.

Figure 8:
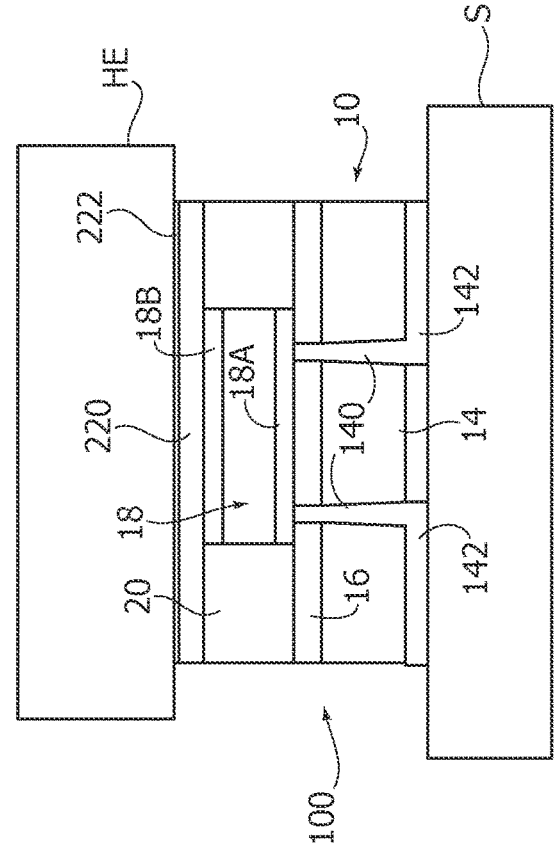
FIGS. 8 and 9 are cross-sectional view across possible mounting arrangements of semiconductor devices produced according with one or more embodiments of the present description.
Figure 9:
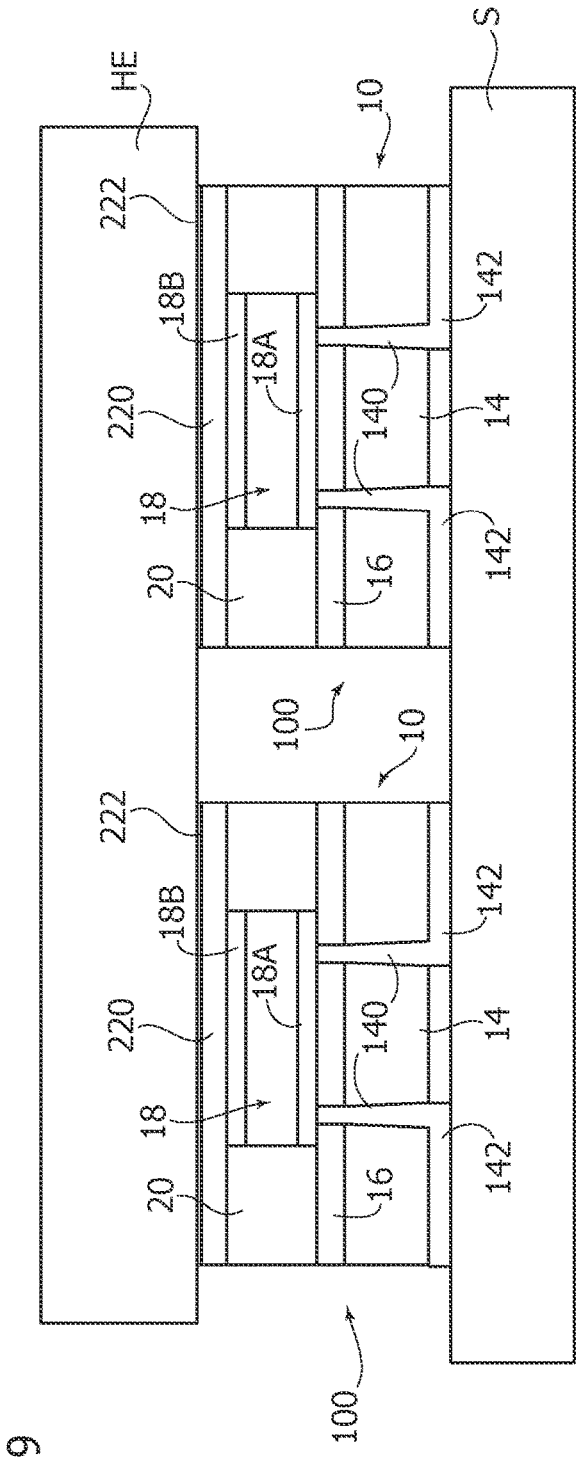

Devices such as 100 can then be arranged (in manner known per se to those of skill in the art) on a support substrate S such as a printed circuit board or PCB as represented in FIGS. 8 and 9 with the electrical-conductive lines 142 facing the substrate S and providing a desired routing pattern of electrical connections for the semiconductor die or dice 18.

An external heat extractor (heat sink) HE can be coupled (for instance soldered at a solder layer 222) in heat transfer relationship to the (metal) plated layer 220 formed on the exposed backside metallization 18B of the die or dice 18 is exposed.

FIG. 8 refers by way of example to an arrangement where a respective individual heat extractor HE is coupled to a single device 100.

FIG. 9 refers, again by way of example, to an arrangement where a heat extractor HE is coupled to plural (e.g., two) devices 100.

FIG. 7 is exemplary of blades B used for cutting at the regions 12 of electrically conductive material the laminar substrate 10 having a plurality of semiconductor chips 18 arranged thereon, with the encapsulation 20 of LDS material formed thereon and processed with laser direct structuring processing LB applied thereto.

Cutting (singulation) at the regions 12 as exemplified in FIG. 7 removes the regions 12 as well the (second) vias 200 that extend through the encapsulation 20 of LDS material and produces a plurality of singulated semiconductor devices 100 each comprising a respective portion of the thermally conductive layer 220.

FIG. 8 is thus exemplary of coupling a heat extractor body HE of thermally conductive material in heat transfer relationship with (such a respective portion of) the thermally conductive layer 220.

Conversely, FIG. 9 is exemplary of coupling a single (common) heat extractor body HE of thermally conductive material in heat transfer relationship with respective portions of the thermally conductive layer 220 in two (or more) semiconductor devices 100.

Using a heat extractor HE common to plural devices 100 as exemplified in FIG. 9 may turn out to be beneficial in order to improve heat dissipation by facilitating convection flows, for instance.

A backside metallization layer such as the layer 220, plated on the exposed backside metallization 18B of the die or dice 18, facilitates heat dissipation towards the heat extractor 104 by avoiding conventional die attach material and provide effective heat dissipation over the whole surface of the package.

The resulting outline is small and compact in so far as a conventional leadframe is no longer employed.

Simulation experiments have shown that an arrangement as disclosed herein may provide a noteworthy reduction (−27%, for instance) in the temperature reached during operation in a power semiconductor device.

Without prejudice to the underlying principles, the details and embodiments may vary, even significantly, with respect to what has been described herein merely by way of example without departing from the extent of protection.

The claims are an integral part of the technical teaching provided herein respect of the embodiments.

The extent of protection is determined by the annexed claims.

The invention claimed is:

1. A method, comprising steps performed in the following order:
providing a laminar substrate having an alternation of regions of electrically conductive material and laser direct structuring (LDS) material, respectively;
arranging a semiconductor chip on a region of LDS material in the laminar substrate, the semiconductor chip having a front active area facing towards the laminar substrate and a metallized back surface facing away from the laminar substrate;
forming an encapsulation of LDS material onto the laminar substrate to encapsulate the semiconductor chip, wherein the encapsulation of LDS material has an outer surface facing away from the laminar substrate, and wherein the metallized back surface of the semiconductor chip is exposed at said outer surface;
applying laser direct structuring processing to said region of LDS material in the laminar substrate to provide first electrically conductive lines towards the front active area of the semiconductor chip, said first electrically conductive lines comprising at least one first via extending through said region of LDS material in the laminar substrate to the front active area of the semiconductor chip; and
applying laser direct structuring processing to the encapsulation of LDS material to provide at least one second via extending through said encapsulation of LDS material to a region of electrically conductive material in said laminar substrate as well as a thermally conductive layer plated over the outer surface of the encapsulation of LDS material, wherein the thermally conductive layer extends in contact with the metallized back surface of the semiconductor chip exposed at said outer surface of the encapsulation of LDS material.

2. The method of claim 1, further comprising removing said at least one second via extending through said encapsulation of LDS material as well as said region of electrically conductive material in said laminar substrate.

3. The method of claim 1, further comprising coupling a heat extractor body of thermally conductive material in heat transfer relationship with said thermally conductive layer.

4. The method of claim 1, further comprising laminating an insulating layer onto said laminar substrate prior to arranging the semiconductor chip thereon, wherein the insulating layer lies intermediate said laminar substrate and the active area of the semiconductor chip.

5. The method of claim 1, wherein forming the encapsulation of LDS material onto the laminar substrate to encapsulate the semiconductor chip comprises:
applying LDS material onto the laminar substrate having the semiconductor chip arranged thereon, wherein the semiconductor chip is buried in said LDS material; and
partly removing said LDS material applied onto the laminar substrate to provide said outer surface of the encapsulation of LDS material having the metallized back surface of the semiconductor chip exposed at said outer surface of the encapsulation of LDS material.

6. The method of claim 1, wherein said first electrically conductive lines towards the front active area of the semiconductor chip comprise electrically conductive lines extending over a surface of the laminar substrate opposite said semiconductor chip.

7. A method, comprising steps performed in the following order:
providing a laminar substrate having an alternation of regions of electrically conductive material and laser direct structuring (LDS) material, respectively;
arranging a plurality of semiconductor chips on a respective plurality of regions of LDS material in the laminar substrate, each semiconductor chip having a front active area towards the laminar substrate and a metallized back surface facing away from the laminar substrate;
forming an encapsulation of LDS material onto the laminar substrate to encapsulate the plurality of semiconductor chips, wherein the encapsulation of LDS material has an outer surface facing away from the laminar substrate, and wherein the metallized back surfaces of each of the plurality of semiconductor chips is exposed at said outer surface;
applying laser direct structuring processing to said regions of LDS material in the laminar substrate to provide first electrically conductive lines towards the front active area of each of the plurality of semiconductor chips, said first electrically conductive lines comprising a plurality of first vias extending through said regions of LDS material in the laminar substrate to the front active areas of the plurality of semiconductor chips;
applying laser direct structuring processing to the encapsulation of LDS material to provide a plurality of second vias extending through said encapsulation of LDS material to regions of electrically conductive material in said laminar substrate as well as a thermally conductive layer plated over the outer surface of the encapsulation of LDS material, wherein the thermally conductive layer extends in contact with the metallized back surfaces of the plurality of semiconductor chips exposed at said outer surface of the encapsulation of LDS material; and
cutting at said regions of electrically conductive material through the laminar substrate and said encapsulation of LDS material formed thereon, wherein said cutting removes said plurality of second vias extending through said encapsulation of LDS material and produces a plurality of singulated semiconductor devices that each comprise a respective portion of said thermally conductive layer.

8. The method of claim 7, further comprising coupling a heat extractor body of thermally conductive material in heat transfer relationship with the respective portion of said thermally conductive layer.

9. The method of claim 7, further comprising coupling a single heat extractor body of thermally conductive material in heat transfer relationship with a plurality of respective portions of said thermally conductive layer in at least two semiconductor devices of said plurality of singulated semiconductor devices.

10. The method of claim 7, further comprising laminating an insulating layer onto said laminar substrate prior to arranging said pluralirty of semiconductor chips thereon, wherein the insulating layer lies intermediate said laminar substrate and the active area of each semiconductor chip.

11. The method of claim 7, wherein forming the encapsulation of LDS material onto the laminar substrate to encapsulate the plurality of semiconductor chips comprises:
applying LDS material onto the laminar substrate having said plurality of semiconductor chips arranged thereon, wherein the plurality of semiconductor chips are buried in said LDS material applied onto the laminar substrate; and
partly removing said LDS material applied onto the laminar substrate to provide said outer surface of the encapsulation of LDS material having the metallized back surfaces of the plurality of semiconductor chips exposed at said outer surface of the encapsulation of LDS material.

12. The method of claim 7, wherein said first electrically conductive lines towards the front active area of the at least one semiconductor chip comprise electrically conductive lines extending over a surface of the laminar substrate opposite said plurality of semiconductor chips.

* * * * *